United States Patent [19]

Icel et al.

[11] Patent Number: 5,248,624
[45] Date of Patent: Sep. 28, 1993

[54] METHOD OF MAKING ISOLATED VERTICAL PNP TRANSISTOR IN A COMPLEMENTARY BICMOS PROCESS WITH EEPROM MEMORY

[75] Inventors: Ali B. Icel, Sunnyvale; Omer L. Akkan, San Jose, both of Calif.

[73] Assignee: Exar Corporation, San Jose, Calif.

[21] Appl. No.: 749,076

[22] Filed: Aug. 23, 1991

[51] Int. Cl.⁵ .................. H01L 21/331; H01L 21/336
[52] U.S. Cl. ........................................ 437/31; 437/52; 437/57; 437/29
[58] Field of Search ................. 437/31, 33, 52, 56, 437/57, 29, 26; 257/549

[56] References Cited

U.S. PATENT DOCUMENTS

| | | | |
|---|---|---|---|
| 4,159,915 | 7/1979 | Anantha et al. | 437/33 |
| 4,404,048 | 9/1983 | Vogelzang | 437/26 |
| 4,529,456 | 7/1985 | Anzai et al. | 437/57 |
| 4,637,125 | 1/1987 | Iwasaki et al. | 437/57 |
| 4,641,419 | 2/1987 | Kudo | 437/31 |
| 4,830,973 | 5/1989 | Mastroianni | |
| 4,855,244 | 8/1989 | Hutter et al. | |
| 5,011,784 | 4/1991 | Ratnakumar | |
| 5,023,194 | 6/1991 | Gianella | 437/31 |
| 5,066,602 | 11/1991 | Takemoto et al. | 437/31 |

OTHER PUBLICATIONS

K. Soejima, A. Shida et al., "A BICMOS technology with 660 MHz vertical PNP transistor for Analog/Digital ASICs", IEEE JSSC, vol. 25, Apr. 1990.

D. de Lang, E. Bladt et al., "Integration of Vertical PNP Transistors in a Double-Polysilicon Bi-CMOS Process", 1989 Bipolar Circuits and Technology Meeting, p. 190, Minnesota, 1989.

J. Kendall, B. Rioux, L. Bourbonnais et al., "BANCMOS: A 25V Analog-Digital BICMOS Process", 1990 Bipolar Circuits and Technology Meeting, p. 86, Minnesota, 1990.

D. Aull, A. Spires, P. Davis, S. Moyer, "A High-voltage IC for a Transformerless Trunk and Subscriber Line Interface", IEEE JSSC, vol. 16, Aug. 1981.

T. Kikkawa, T. Suganuma et al., "A New Complementary Transistor Structure for Analog Integrated Circuits", IEDM-80, p. 65, 1980.

A. Feygenson et al., "CBIC-V, a New Very High Speed Complementary Silicon Bipolar IC Process", 1989 Bipolar Circuits and Technology Meeting, p. 173, Minnesota, 1989.

Ghandhi, VLSI Fabrication Principles, 1983, John Wiley & Sons, pp. 299-301, 327, 328, 357-358.

*Primary Examiner*—T. N. Quach
*Attorney, Agent, or Firm*—Townsend and Townsend Khourie and Crew

[57] ABSTRACT

A method and apparatus for an improved isolated vertical PNP in a complementary BICMOS process with EEPROM memory is provided. The isolated vertical PNP transistor is formed on a P−substrate with a P−epitaxial (EPI) layer. The collector of the vertical PNP transistor is isolated with an N− buried layer formed in the P substrate and an N+ buried layer on the sidewalls for isolation. The collector is formed with a P+ layer buried in the N− layer. Subsequently, the P− EPI layer is deposited and an N+ sinker is diffused down to the N+ buried layer to complete the isolation. The emitter of the vertical PNP transistor is formed during the same step as the P+ source/drain implant for the CMOS transistors. By forming the collector and its isolation regions in the substrate before depositing the EPI layer, the process is compatible with forming EEPROM which is done after the epi is deposited. An earlier implantation of the N base layer in the front-end of the process allows a deeper base junction depth, for formation of a high voltage PNP transistor. Alternately, the base can be formed later in the process, for a low voltage transistor. The presence of both high and low voltage transistors makes integration of EEPROM on the same chip practical. Only two dopant species (arsenic and boron) are used for the formation of N+, N− and P+ buried layers. Thus the present invention provides better manufacturability than the prior art processes which use three dopant species.

25 Claims, 3 Drawing Sheets

METHOD OF MAKING ISOLATED VERTICAL PNP TRANSISTOR IN A COMPLEMENTARY BICMOS PROCESS WITH EEPROM MEMORY

BACKGROUND

The present invention relates in general to a method of fabricating semiconductor devices and in particular to BICMOS or bipolar technologies.

The availability of PNP transistors with a performance comparable to NPN transistors in a BICMOS or bipolar technology provides a considerable advantage in the design of analog and digital circuits. The bandwidth of operational amplifiers (OpAmps) is typically limited by the output stage. The use of a high performance PNP in the level shift and output stages can improve the performance of OpAmps considerably (especially those with capacitive loads). Some other analog circuits benefit from the complementary NPN and PNP transistors, such as phase locked loop circuits, D/A converters, voltage regulators, high speed comparators, charge pump circuits and video amplifiers. In digital circuits, since both PNP and NPN transistors are involved during pull-up and pull-down stages of switching, the slower device determines the performance limits of the circuit. As a result, the use of a PNP transistor with a performance comparable to NPN will considerably improve the overall performance of the circuit. Another application of the complementary BICMOS technology is the full swing BICMOS logic circuits, with a performance leverage over the conventional BICMOS circuits for reduced power supply voltage operation.

In the conventional processes, the only available PNP transistors are lateral PNP and common collector substrate PNP. The relatively large basewidth, and a result, lower cutoff frequency of lateral PNP transistors causes a limitation in the design of high performance circuits. On the other hand, even though substrate PNPs exhibit relatively higher cutoff frequencies, they suffer from being common collector devices and are limited to certain applications.

Therefore, the effort of incorporating high speed isolated vertical PNP transistors with high current drive capability in the same BICMOS or bipolar process with high performance NPN transistors is well justified. On the other hand, the combination of analog, digital and programmable memory functions on a single chip is needed for the system level applications. A further requirement is the combination of high and low voltage devices in the same chip. The availability of such a multitude of device types makes possible the integration of a complete system on a single chip.

In the prior art, the methods of forming complementary MOS (CMOS) transistors at the same time as NPN, lateral PNP and substrate PNP transistors are well known. Some methods of forming complementary NPN and PNP transistors in the same process as CMOS transistors are also known. However, the BICMOS or complementary BICMOS processes which are developed from the bipolar technologies are usually penalized with lower performance CMOS. Furthermore, the complementary BICMOS processes in the prior art do not offer the flexibility, performance and the variety of devices on the same substrate as offered by the present invention.

The following is a list of the references on the complementary BICMOS and complementary bipolar technologies with isolated vertical PNPs:
1. K. Soejima, A. Shida et al., "A BICMOS technology with 660 MHz vertical PNP transistor for Analog/Digital ASICs", IEEE JSSC, Vol. 25, April 1990.
2. D. de Lang, E. Bladt et al., "Integration of Vertical PNP Transistors in a Double-Polysilicon Bi-CMOS Process", 1989 Bipolar Circuits and Technology Meeting, p.190, Minnesota, 1989.
3. J. Kendall, B. Rioux, L. Bourbonnais et al., "BANCMOS: A 25 V Analog-Digital BICMOS Process", 1990 Bipolar Circuits and Technology Meeting, p.86, Minnesota, 1990.
4. L. Hutter, J. Trogolo, "Method of Making Vertical PNP in Merged Bipolar/CMOS Technology", U.S. Pat. No. 4,855,244.
5. K. Ratnakumar, "Method of Making a Complementary BICMOS Process With Isolated Vertical PNP Transistors", U.S. Pat. No. 5,011,784.
6. S. Mastroianni, "Merged Complementary Bipolar and MOS Means and Method", U.S. Pat. No. 4,830,973.
7. D. Aull, A. Spires, P. Davis, S. Moyer, "A High-voltage IC for a Transformerless Trunk and Subscriber Line Interface", IEEE JSSC, Vol.16, August 1981.
8. T. Kikkawa, T. Suganuma et al., "A New Complementary Transistor Structure for Analog Integrated Circuits", IEDM-80, p. 65, 1980.
9. A. Feygenson et al., "CBIC-V, a New Very High Speed Complementary Silicon Bipolar IC Process", 1989 Bipolar Circuits and Technology Meeting, p. 173, Minnesota, 1989.

SUMMARY OF THE INVENTION

The present invention provides a method and apparatus for an improved isolated vertical PNP in a complementary BICMOS process with EEPROM memory. The isolated vertical PNP transistor is formed on a P— substrate with a P—epitaxial (EPI) layer. The collector of the vertical PNP transistor is isolated with an N— buried layer formed in the P substrate and an N+ buried layer on the sidewalls for isolation. The collector is formed with a P+ layer buried in the N— layer. Subsequently, the P— EPI layer is deposited and an N+ sinker is diffused down to the N+ buried layer to complete the isolation.

By forming the collector and its isolation regions in the substrate before depositing the EPI layer, the process is compatible with forming EEPROM which is done after the epi is deposited. Thus, the thermal steps for the vertical PNP transistor will not affect the later formed EEPROM. In addition, the early formation of the P collector of the vertical PNP transistor provides flexibility in when the N— base layer is implanted. An earlier implantation of the N base layer in the front-end of the process allows a deeper base junction depth, for formation of a high voltage PNP transistor. Alternately, the base can be formed later in the process, for a low voltage transistor. The presence of both high and low voltage transistors makes integration of EEPROM on the same chip practical. The early formation of the vertical PNP collector also provides flexibility in optimizing the NPN transistor characteristics. The emitter of the vertical PNP transistor is formed during the same step as the P+ source/drain implant for the CMOS transistors.

The present invention also uses only two dopant species (arsenic and boron) for the formation of N+, N− and P+ buried layers. Thus the present invention provides better manufacturability than the prior art processes which use three dopant species.

In one option, the N−well implantation is also done in the isolation region, in addition to the N+ sinker, to improve the isolation region to P epi breakdown voltage.

The collector to base breakdown voltage of the vertical PNP transistor is improved by doing a P−type field implant, before the thick field oxide growth, which is spaced away from the N−base layer of the PNP transistor.

Poly 1 NMOS and PMOS high voltage transistors are needed for the EEPROM, while high speed, low voltage NMOS and PMOS transistors are used with a 5 V complementary BICMOS application. The process of the present invention produces both, with the only additional thermal step being the thin gate oxidation for the Poly 2 transistors.

For a fuller understanding of the nature and advantages of the present invention, reference should be made to the ensuing detailed description taken in conjunction with the accompanying drawings.

DETAILED DESCRIPTION OF THE PREFERRED EMBODIMENTS

The present invention disclosed and claimed herein describes a method and apparatus for an isolated vertical PNP in an improved complementary BICMOS process with EEPROM memory. The isolated vertical PNP of the present invention is formed on a common p−epi layer on a p−substrate with isolated vertical NPN, lateral PNP, substrate PNP, two types of P−channel and N−channel MOS transistors with different gate oxide thicknesses and EEPROM memory. The emitter of the isolated vertical PNP is formed during the same step as the P+ source/drain implant. A separate mask and phosphorus implant is used to form the N−base of the vertical PNP.

In one method of the present invention, the N−base layer is formed in the front-end of the process before the field oxidation to achieve a deeper base junction depth (0.8 to 1.0 μm) and higher collector-emitter breakdown voltage (LVCEO>25 V) with a cutoff frequency fT in the range of 0.7 to 1.2 GHz at VCB= −5 V with an HFE of 60 to 140.

A second method of forming the N−base layer is the implantation of phosphorus in the back-end of the process before the formation of source and drain regions. This method gives the advantage of achieving a steep and shallow N−base profile with a junction depth of 0.5 to 0.6 μm and an fT larger than 2 GHz with the collector-emitter breakdown of LVCEO>7 V for 5 V applications. Both methods use exactly the same emitter, collector and isolation formation techniques. An N+ source-drain implant into the N−base region is used to form a low resistance extrinsic base region where the base contact is being done for both N−base formation methods. The performance achieved by the present invention exceeds the previously reported results in the prior art for complementary BICMOS processes. [References 1–5].

The vertical PNP is isolated from the other devices by means of deep N+ sinker, N−well and N+ buried layer on the sidewall of the vertical PNP cell. The N+ sinker and N+ buried layer diffusions are also used to reduce the collector resistance of the isolated NPN transistors. The isolation of the vertical PNP from the p−substrate on the bottom is achieved by the use of a low concentration N− buried layer formed with the arsenic implantation. The N− buried layer is merged with the N+ buried layer rings on the sidewall. A P+ buried layer is formed by the implantation of boron into the N− buried layer region. The P+ buried layer and P−epi layer form the collector of the vertical PNP structure. A P+ source/drain implant is done into the P−epi region to form the collector contact for the vertical PNP. It is also possible to form a deep P+ diffusion which reaches the P+ buried layer in order to further reduce the collector resistance of the vertical PNP.

Other device types formed on the common substrate are listed below:

1. An isolated vertical NPN with a collector consisting of an N− Well and N+ buried Layer contacted with an N+ source-drain (S/D) and/or N+ Sinker (Deep N+ diffusion reaching the N+ Buried Layer), a base consisting of a P−base layer contacted with a P+ source-drain implant and an emitter consisting of a N+ S/D implant and high voltage (HV) Implant.

2. A lateral PNP with a collector and emitter consisting of a P+ source/drain implant layer and a base consisting of an N−well contacted with an N+ S/D. An N+ buried layer is also formed under the N−well to suppress the parasitic vertical PNP action to the p−substrate.

3. A substrate PNP with a collector consisting of the p-substrate contacted with a P+S/D, a base consisting of an N-well contacted with an N+ S/D and an emitter consisting of a P+ S/D implant.

4. Two different types of NMOS and PMOS transistors may be available at the same time in the modular complementary BICMOS process with EEPROM (referred to as E²CBICMOS hereinafter):
   a) Poly 1 NMOS and PMOS transistors with a thick gate oxide thickness in the range of 700 to 800 Å used for 15 V high voltage applications as well as in the EEPROM section with a breakdown voltage over 21 V for NMOS and 19 V for PMOS devices,
   b) Poly 2 NMOS and PMOS transistors with a thin gate oxide in the range of 300 Å used for 5 V high speed Digital and/or low voltage analog applications.

The use of EEPROM requires the integration of high voltage devices such as Poly 1 transistors. For a 5 V complementary BICMOS process without EEPROM, only Poly 2 transistors might be used with the advantage of being able to go to smaller channel lengths. The formation of Poly 1 transistors requires only threshold implant and masking steps without any additional thermal steps to the core process. The core process is defined as the process which has all the steps common to all the process versions which may be derived from the most general process flow. On the other hand, the formation of Poly 2 transistors requires an extra thermal step which is the thin gate oxidation. This additional step has a negligible impact on the other device characteristics. The P+ S/D regions of the Poly 1 and Poly 2 devices are formed at the same time. An arsenic implant for the N+ S/D regions is also common to both Poly 1 and Poly 2 NMOS transistors. Poly 1 NMOS transistor S/D regions also receive an extra N− phosphorus implant in order to create a double diffused structure to improve breakdown and hot carrier effects. The same phosphorus implant is done only partially into the S/D regions of the Poly 2 NMOS transistors to prevent junction spiking under the contacts. As explained later, this N− phosphorus implant may also be optimized to form the N−base of the vertical PNP simultaneously, thereby eliminating the separate mask and implant for the N-base layer.

5. An EEPROM memory which requires a Tunnel implant before the Poly 1 deposition and Tunnel oxide as the extra steps. Tunnel oxide is the thin oxide in the range of 100 Angstroms grown in a small window where the tunneling of electrons to the floating gate takes place. Two additional masks are required for the formation of EEPROM memory.

6. High precision interpoly capacitors formed by two layers of Poly separated by a high quality oxide/nitride/oxide dielectric.

7. Implanted P−base, N−well, P+, N+ and N−base resistors and thin film type Poly 1 and Poly 2 resistors are also available in the same process. With an extra mask, it is also possible to form Poly 2 resistors with high sheet resistance (on the order of 2 Kohm/square) which are used for the analog applications requiring high value resistors with good matching characteristics.

The object of the preferred embodiment of the present invention is to provide an improved means and method to combine complementary bipolar and complementary MOS transistors and EEPROM memory on a common substrate along with high precision interpoly capacitors and various implant and poly resistors with two layers of polysilicon and two layers of metal interconnection. This type of technology is key to the design of advanced mixed signal application specific integrated circuits (ASIC's). However, the existence of all the different device types at the same time is not required for the present invention. The vertical PNP can be used: a) with only bipolar devices in a complementary bipolar process; b) with both CMOS and bipolar in a complementary BICMOS process without EEPROM; or c) with CMOS and bipolar in a complementary BICMOS process with EEPROM. The steps required for the formation of the vertical PNP are the same for different process versions. A modular process architecture allows the circuit designers to select the optimum combination of different devices to meet the application requirements. The modular architecture of the present invention is being accomplished by the use of common process steps in the forming of different devices. The additional thermal steps are being done in the beginning of the process so that they do not affect the characteristics of the other devices. Most of the devices are formed by masking and ion implantation techniques. The implanted species are annealed with the common thermal steps.

Figure 1A:
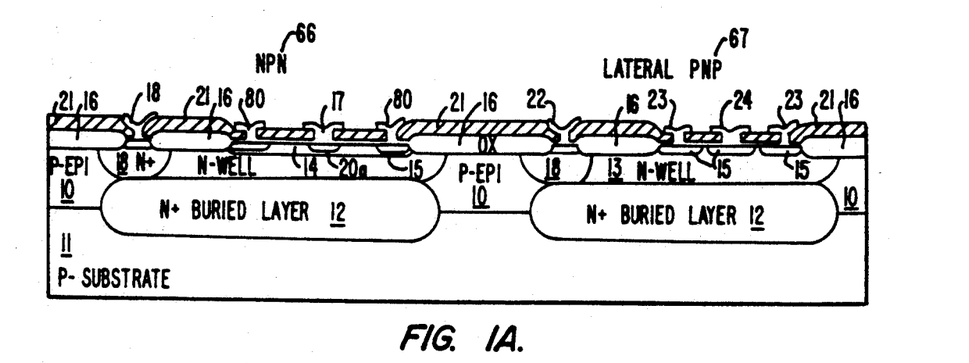
FIG. 1A is a cross-sectional view of an embodiment of the isolated vertical NPN and lateral PNP transistors of the present invention.

FIG. 1A gives a cross-sectional view of an isolated vertical NPN transistor 66 and a lateral PNP transistor 67. An implanted and diffused N−well layer 13 forms a collector connected to contact 18 of NPN transistor 66 and a base connected to contact 22 of lateral PNP transistor 67. The same N−well layer 13 is common to a Poly 1 PMOS transistor 69, a Poly 2 PMOS transistor 72, NPN transistor 66 and lateral PNP transistor 67. N−well layer 13 also forms the base of the conventional substrate PNP which is not shown in the Figures. An arsenic implanted N+ buried layer 12 is formed under the N−well 13 of NPN transistor 66. A deep N+ sinker diffusion 19 which reaches the N+ buried layer 12 and N+ source/drain implant 20 are formed inside N−well 13 in order to reduce the collector resistance of NPN transistor 66. The formation of N+ buried layer 12 under the collector of NPN transistor 66 is required to suppress the parasitic PNP transistor formed by a P−base 14 of NPN transistor 66 acting as a P−type emitter, N−well 13 acting as an N−type base and P−substrate 11 acting as a collector. The parasitic PNP starts to be active when NPN transistor 66 goes into saturation. The turn-on of the parasitic PNP may reduce the performance of NPN transistor 66 considerably when an N+ buried layer is not present. The active or intrinsic base of NPN transistor 66 is formed by a separate P− base implant 14. The inactive or extrinsic base 80a is formed at the same time as P+ source-drain implant 15 into P−base layer 14 in order to form a low resistance region for a base contact 80. P+ source-drain implant 15 also helps to reduce the base resistance of the NPN transistor 66. N+ emitter 17 of NPN transistor 66 is formed at the same time as N+ source/drain implant 20. The use of a separate P−base implant 14 gives a flexibility in the optimization of NPN transistor 66 characteristics. On the other hand, the use of P+ source/drain implant 15 instead of P−base implant 14 as proposed in reference 4 may create a major trade-off in the PMOS characteristics. In order to have a reasonable base-emitter breakdown voltage, the P+ source/drain concentration has to be lowered, which will cause an increase in series resistance in the PMOS transistors. Furthermore, the junction depth of the P+ source/drain has to be deeper in order to have a reasonable basewidth which will adversely affect the short channel behavior of the PMOS transistors.

N+ sinker 19, N+ source/drain implant 20 and N+ buried layer 12 are also used to reduce the base resistance of lateral PNP 67. The P+ regions 15 connected to collector contact 23 and emitter contact 24 of the lateral PNP are formed at the same time as the P+ source/drain implant 15 shown in FIGS. 1B and 2.

Figure 1B:
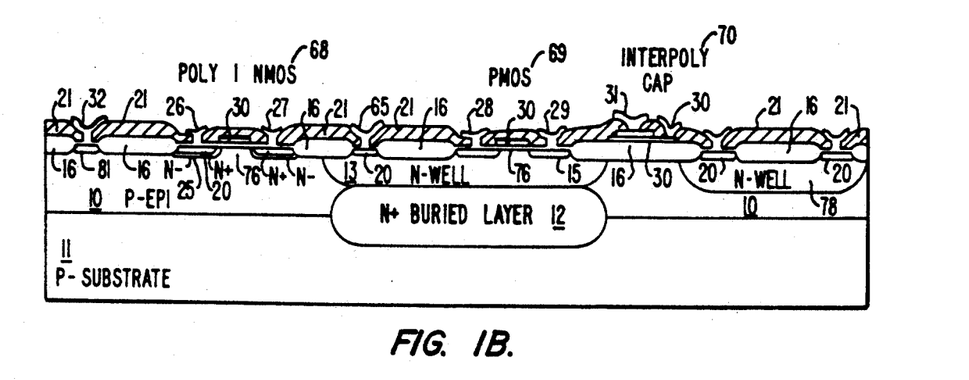
FIG. 1B is a cross-sectional view of an embodiment of the Poly 1 NMOS and PMOS transistors, Interpoly capacitor and N−well resistor of the present invention.
Figure 2:
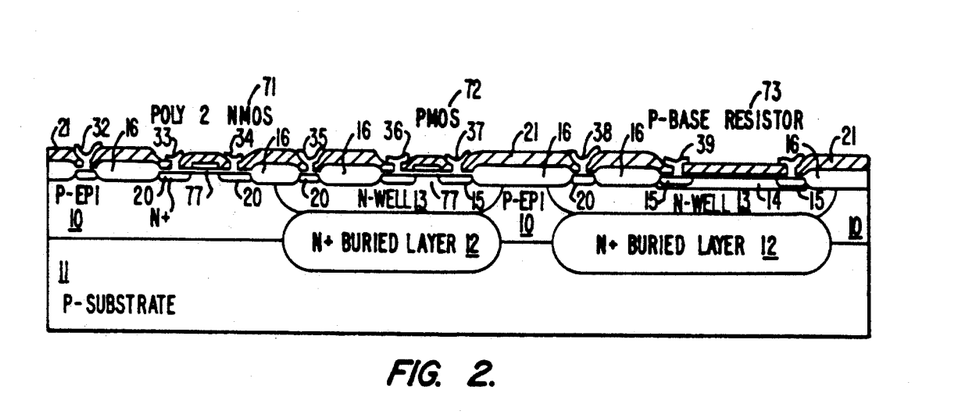
FIG. 2 is a cross-sectional view of an embodiment of the Poly 2 NMOS and PMOS transistors and P−base resistors of the present invention.

FIG. 1B shows the cross-section of a Poly 1 NMOS transistor 68 and a PMOS transistor 69, an interpoly capacitor 70 and an N−well resistor 78. The thick gate oxide 76 in the range of 750 Å is grown after field and sacrificial oxidation steps. This oxide 76 is always grown whether Poly 1 NMOS transistor 68 and PMOS transistor 69 are used or not to keep the modularity of the $E^2$CBICMOS process. The N+ source 26 and drain 27 of Poly 1 NMOS transistor 68 are formed by N+ source/drain arsenic implant 20 and by N+ phosphorus implant 25 in order to form a double diffused drain structure for high voltage operation. In the case of availability of both Poly 1 (FIG. 1B) and Poly 2 CMOS devices (FIG. 2) in the same process flow, a mask is required to implant the N− phosphorus 25 selectively under only the contact regions of the N+ source 33 and drain 34 of Poly 2 NMOS transistors 71 in FIG. 2. Poly 2 NMOS transistor 71 in FIG. 2 has a shallower N+ source/drain region and thinner gate oxide 77 in the range of 300 Å and can be used for high speed low voltage applications.

Both Poly 1 PMOS transistor 69 (FIG. 1B) and Poly 2 PMOS transistor 72 (FIG. 2) are formed in the same N−well 13 and with the same P+ source/drain implant 15. The only difference in between Poly 1 PMOS 69 (FIG. 1B) and Poly 2 PMOS 72 (FIG. 2) transistors is the gate oxide thickness. N+ buried layer 12 is formed under the N−well 13 of both PMOS transistors in order to increase the latch-up immunity.

Figure 3:
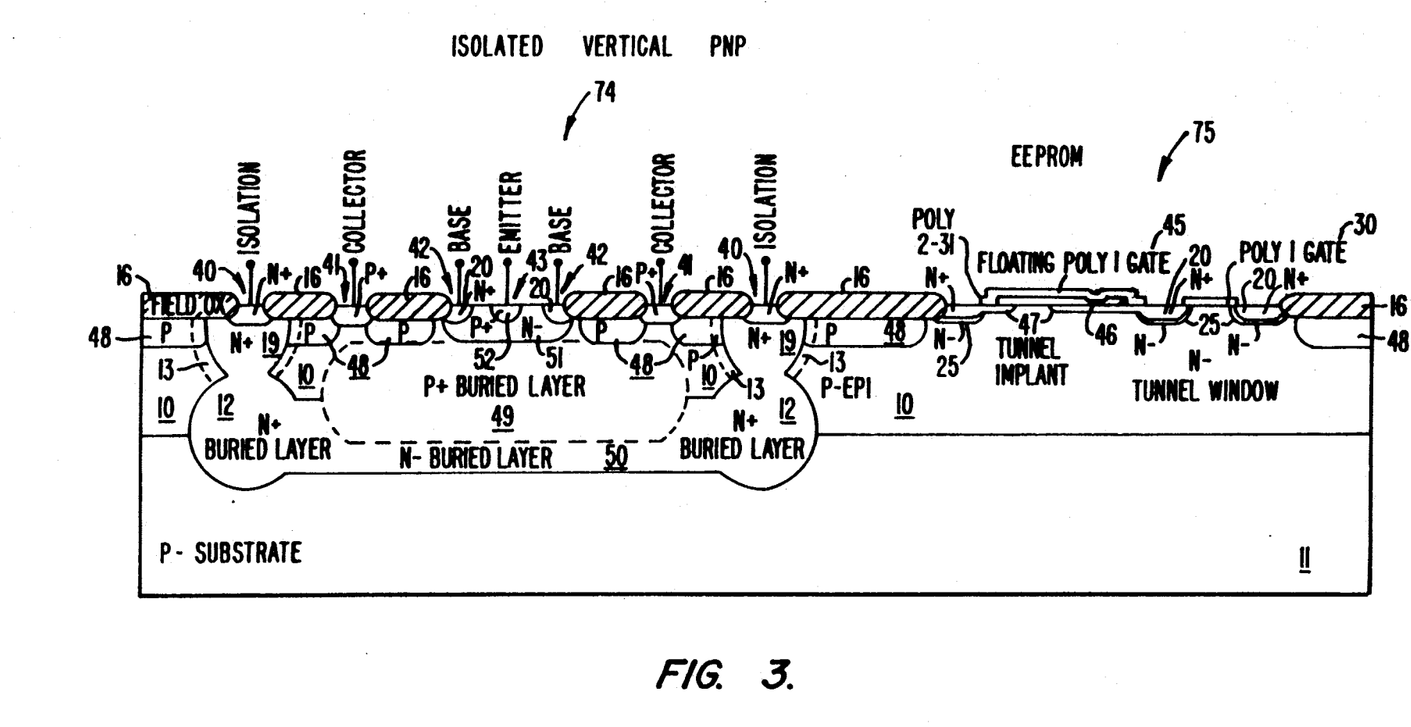
FIG. 3 is a cross-sectional view of an embodiment of the isolated vertical PNP and EEPROM cell on the same substrate of the present invention.

FIG. 3 shows a cross-sectional view of a vertical PNP transistor structure 74 resulting from the present invention, in the same substrate as the EEPROM memory cell 75. EEPROM cell 75 consists of a double poly structure with Poly 2 region 31 used as the control gate and Poly 1 region 45 used as the floating gate. A tunnel implant 47 forms a native transistor under the double poly stack. The native transistor has a 750 Å gate oxide and does not receive any threshold implant. As a result, the native transistor has a threshold voltage around 0 V. The threshold voltage of the native transistor is modulated by the charge in the floating gate 45. A tunnel window 46 is opened over the tunnel implant 47 and a thin layer of tunnel oxide in the range of 100 to 115 Å is grown in the window 46. The tunneling of the electrons to the floating 45 gate takes place through the tunnel window 46. Poly 2 region 31 and floating gate Poly 1 region 45 are separated by a high quality oxide/nitride/oxide film which is also used as the dielectric of the interpoly capacitors 70 (FIG. 1B). The implementation of EEPROM memory 75 in the complementary BICMOS process requires two masks: 1) Tunnel implant, 2) Tunnel window. The only extra thermal step is the tunnel oxidation which is a low temperature step.

FIGS. 4A-E in conjunction with Table I show the process steps used in the formation of N+ buried layer 12, N− buried layer 50 and P+ buried layer 63. The starting material used for the E²CBICMOS process is P−type silicon substrate 11. First, a thin pad oxide (Step 1 of Table I) is grown and the P−substrate 11 is implanted with Boron (Step 2). The purpose of this P−type implant is to increase the surface concentration of the P−substrate 11 in order to provide isolation in between N+ buried layers 12. On the other hand, as the dopant concentration under the N+ buried layers 12 remains close to the uniform substrate concentration, an improvement in the N+ buried layer 12 to P−substrate 11 capacitance is achieved compared to the case where a P−substrate concentration high enough is used to provide isolation in between N+ buried layers 12. This improvement, which can be on the order of 20% or larger, is especially important in the reduction of the collector 18 to substrate 11 capacitance (CCS) of the NPN transistors 66 used in some applications such as emitter coupled logic (ECL).

After the boron implant, a thick pad oxide 55 is grown (Step 3) and an N+ buried layer mask (Step 4) is used to define N+ buried layers 12 as well as N− buried layers 50. The thick pad oxide 55 is etched and a thin pad oxide 56 is grown (Step 5). A second mask 57 is used (Step 6) to protect the N− buried layer 50 regions from high dose N+ buried layer 12 arsenic 53 implant (Step 7, FIG. 4A). This implant 53 forms the N+ isolation rings 12 around the vertical PNP and all the N+ buried layers 12. After the photoresist 56 strip, a blanket low dose arsenic implant is done to form the N− buried layer 50 (Step 8). The same implant 79 also penetrates into the N+ buried layers 12. The purpose of N− buried layer 50 is to isolate the vertical PNP 74 from the substrate 11 (FIG. 5). The reason for using a low dose N− buried layer implant 50 is to achieve a high vertical PNP collector 41, 49 to N− buried layer 50 breakdown voltage. On the other hand, the use of high dose N+ buried layer 12 ring around the vertical PNP is to ensure the isolation on the sidewall as the high concentration N+ buried layer 12 will be diffusing upwards more than N− buried layer 50.

One difference of the present invention from the prior art [Ref. 1-9] is the use of an arsenic implant instead of a phosphorus implant for the N− buried layer 50. As the diffusion coefficient of phosphorus is higher than arsenic, the upward diffusion into the epi and the sensitivity to the thermal budget of the process will be more with phosphorus. This constitutes a major disadvantage in a modular process where there might be some changes in the thermal budget. Furthermore, the existence of three different species such as boron, arsenic and phosphorus at the same time during the epitaxial growth requires a special effort in the development of an epitaxial growth process. As the present invention is using only high and low concentration arsenic and boron, the p−epi 10 growth process is exactly the same as in the case when there is no vertical PNP and very consistent dopant profiles can be reproduced.

Figure 4A:
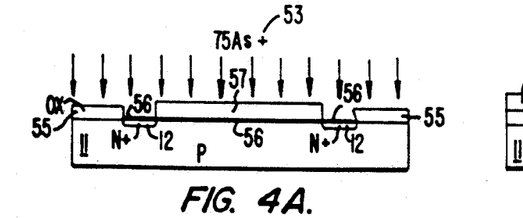
FIGS. 4A–E are diagrams of the formation of the N+, N− and P+ buried layers in the front-end of the process of the present invention.
Figures 4B, 4C, 4E:
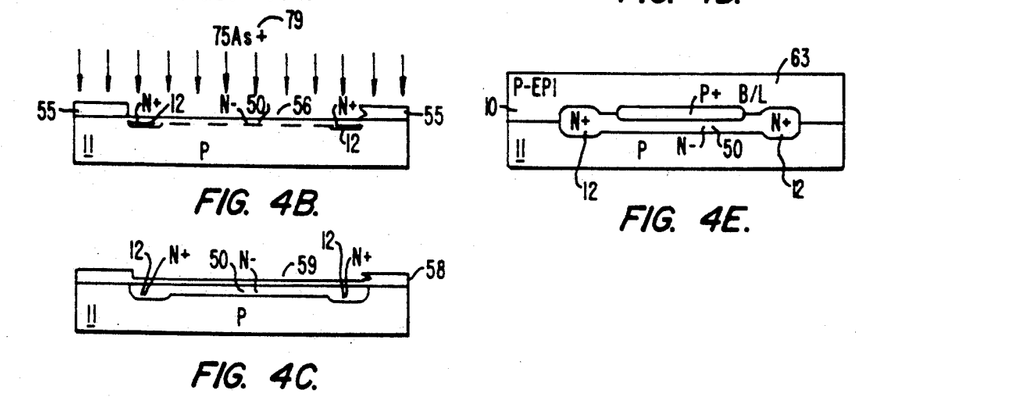
Figure 4D:
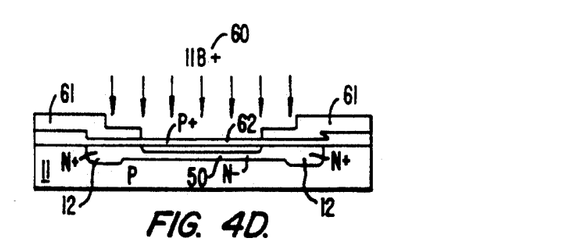

FIG. 4C shows the cross-section after the drive-in (Step 9) of N+ buried layer 12 and N− buried layer 50 at the same time under partially oxidizing ambient. At the end of drive-in, an oxide 59 in the range of 1700 Å is formed on top of the N− buried layers 50. Next, the P+ buried layer mask 61 which is generated as an undersize of N− buried layer mask 53 with a reverse polarity is applied as shown in FIG. 4D (Step 10). A high energy boron implant 60 is done to form P+ buried layer 62 (Step 11). The energy of boron implant 60 has to be high enough for the penetration of the species through the oxide 62 and for the formation of the implant peak below the surface of silicon in order to prevent autodoping during the epitaxy growth. The P+ buried layer 49 also has to be spaced enough from N+ buried layer 12 on the sidewall in order to prevent the degradation of collector 49 to isolation region 40 (N+ sinker 19 and buried layer 12) breakdown.

After a thermal anneal to activate the implanted boron and diffuse the P+ buried layer 63, a P−type epi layer 10 is grown (Step 12) in a single-wafer epi reactor with a high growth rate in order to prevent autodoping. With a single-wafer epi reactor, it is also possible to obtain an excellent thickness uniformity in the order of + or −2% or better. FIG. 4E gives a structural view after the P−epi 10 growth.

Returning to FIG. 3, the creation of the vertical PNP transistor of the present invention will be described in more detail. After the growth of P−type epi layer 10, N−well 13 is formed by the phosphorus implant and diffusion as in a conventional CMOS process (Step 13). A deep N+ sinker diffusion 19 which reaches the N+ buried layer 12 is done before the growth of the thick field oxide 16 (Steps 14, 15). N+ sinker 19 and N+ buried layer 12 form the sidewall isolation of the vertical PNP transistor 74. N—well 13 may also be implanted in the same sidewall isolation region 19, 12 as an oversize of the N+ sinker diffusion in order to improve the isolation region 40 to P—type epi 10 breakdown. However, the use of only low concentration N—well layer 13 in the sidewall isolation without a high concentration N+ sinker diffusion 19 as shown in [Ref. 3] may cause a major limitation in the operation of the vertical PNP. As also explained in [Ref. 1], the vertical PNP transistors generally have two parasitic transistors associated with the main transistor. One is the parasitic NPN transistor with an emitter consisting of N— base 51, a base consisting of P+ buried layer 49 and P—type epi 10 and a collector consisting of N— buried layer 50, N+ buried layer 12 and N+ sinker 19. The second parasitic is a PNP with an emitter consisting of P+ buried layer 49 and P—type epi 10, a base consisting of N— buried layer 50, N+ buried layer 12 and N+ sinker 19 and a collector consisting of P—substrate 11 and P—type epi epi 10. When the vertical PNP 74 goes into saturation, the parasitic NPN transistor is turned on first. As a result, the collector current of the parasitic NPN starts to flow through the isolation region 40. If the concentration of the isolation region 40 is low, the voltage drop in this resistor may cause the turn-on of the parasitic PNP transistor because of the forward biasing of the emitter-base junction. This will further reduce the performance of the vertical PNP 74.

In the present invention, there are two options for the formation of N—base layer 51 by phosphorus implantation. The first option (Steps 16-19) is the formation of N—base layer 51 following, N+ sinker 19 diffusion in order to achieve a high voltage vertical PNP (LVCEO>25 V). Since N—base 51 is formed in an earlier stage in the process, the N—base junction is deep enough for the vertical PNP 74 to sustain a higher voltage. In the second option (Steps 35-38), N—base layer 51 is formed in a later step in the process flow, before arsenic implantation of N+ source 26, 33 and drain 27, 34 in order to achieve a lower voltage (5 V), higher speed version of the vertical PNP 74, since the N—base 51 junction depth and accordingly the basewidth of the PNP 74 is smaller compared to the first option due to the reduced thermal budget. When using this option, it is also possible to optimize the N— phosphorus implant 25 (FIG. 1B) dose so that the same implant 25 can be used for forming the N—base 51 of the vertical PNP 74 and double diffused N+ source 26 and drain 27 of the Poly 1 NMOS transistor 68 simultaneously, thus saving one mask layer.

Both N—base 51 options use the same N+ source/-drain implant 20 and P+ source-drain implant 15 for the formation of extrinsic base 42 and emitter 43 regions, respectively. In order to achieve compatibility in the operating voltage of the vertical NPN transistor 66, a similar two option approach is also taken in the formation of the P—base implant layer 14.

Before the growth of the thick field oxide 16 (Step 22), a P—type (boron) field implant 48 is performed (Step 21) to increase the parasitic field threshold voltage. In the case of vertical PNP 74, the field implant layer 48 is spaced away from the N—base layer 51 in order to improve the collector 41 to base 42 breakdown voltage.

The remaining steps of the process such as the formation of thick and thin gate oxides 76 and 77, threshold adjustment implants, polysilicon gate and interpoly dielectric formation and tunnel implant 47 and tunnel window 46 for EEPROM 75 are performed in a manner similar to the conventional CMOS processes.

Compared to the prior art, the present invention provides the following advantages:

1. A method of making a low and/or high sustaining voltage, high performance vertical PNP in a BICMOS process with EEPROM;

2. The use of only two dopant species (Arsenic, Boron) for the formation of N+, N— and P+ buried layers, as compared to three species (Arsenic, Phosphorus, Boron) in the prior art, simplifying the pre-epitaxial and epitaxial processing, thereby achieving better manufacturability;

3. The capability of forming an optimum N—base dopant profile and junction depth for different operating voltage ranges by using a separate N—base mask and implant, as compared to the use of N—well layer as the N—base of the vertical PNP in the prior art [Ref. 4], limiting the speed/performance of the device;

4. The use of an N—well implantation in combination with the N+ singer and N+ buried layers for the sidewall isolation of the vertical PNP, thereby achieving high collector to isolation breakdown voltage and low isolation layer resistivity simultaneously. the low isolation layer resistivity will help to reduce the parasitic PNP action as explained earlier;

5. The capability of integrating different combinations of high and/or low voltage PMOS and NMOS transistors, high and/or low voltage isolated vertical PNP and NPN transistors, lateral PNP and substrate PNP transistors, 5 different types of implanted resistors, three different types of thin film resistors and EEPROM memory on the same substrate by the use of a modular process, where the addition/subtraction of any of the above mentioned devices has minimal, if any, effect on the electrical properties of other devices formed using the given process sequence.

TABLE 1

| SUMMARY OF PROCESS FLOW | |
|---|---|
| Starting Wafer: | p-type, <100> |
| Process Flow: | 1. Pad oxidation (500 Å) |
| | 2. Blanket p-type implant |
| | 3. Thick oxide growth |
| | 4. N + buried layer (B/L) masking + etch |
| | 5. Thin pad oxide |
| | 6. N — B/L masking |
| | 7. N + B/L implant + resist strip |
| | 8. N — B/L implant |
| | 9. Buried layer drive |
| | 10. P + B/L masking |
| | 11. P + B/L implant + anneal |
| | 12. P — epitaxy |
| | 13. [N — well formation steps] |
| | 14. Sinker mask + etch |
| | 15. Sinker deposition/diffusion |
| | 16. N — base mask (option #1, for High Voltage Vertical PNP) |
| | 17. N — base implant (option #1, for High Voltage Vertical PNP) |
| | 18. P — base mask (option #1, for High Voltage Vertical NPN) |
| | 19. P — base implant (option #1, for High Voltage Vertical NPN) |
| | 20. Nitride deposition) |
| | 21. Active mask and etch |
| | 22. Field implant mask + field implant |
| | 23. [Field oxidation, gate oxidation (poly 1), VT & tunnel implants] |
| | 24. Poly 1 deposition |
| | 25. Poly 1 doping |
| | 26. [Interpoly dielectric formation steps] |
| | 27. Poly 1 masking + etch |
| | 28. Poly 1 edge oxidation |

TABLE 1-continued
SUMMARY OF PROCESS FLOW

29. Array protect mask + etch (only for Poly 2 transistor option)
30. Second gate oxidation (300 Å, only for Poly 2 transistor option)
31. Poly 2 VT implant (only for Poly 2 transistor option)
32. Poly 2 deposition + doping
33. Poly 2 mask + etch
34. pre source/drain oxidation
35. N − base mask (Option #2, for Low Voltage Vertical PNP)
36. N − base implant (Option #2, for Low Voltage Vertical PNP)
37. P − base mask (Option #2, for Low Voltage Vertical NPN)
38. P − base implant (Option #2, for Low Voltage Vertical NPN)
39. Anneal
40. N − phosphorous implant mask + implant (for double diffused Poly 1 NMOS)
41. N + S/D (As75) implant mask + implant
42. Poly 2 oxidation
43. P + S/D implant mask + implant (BF2)
44. [BPSG (Borophosphosilicate glass), metalization, via and passivation steps] FAB OUT

What is claimed is:

1. A method for forming a vertical PNP transistor on a P substrate comprising the steps of:
    forming an N buried layer in said P substrate;
    forming a P buried layer in said N buried layer;
    growing a P epitaxial layer over said buried layers;
    implanting an N base region over said P buried layer;
    implanting a P region in said N base region; and
    forming EEPROM transistors after formation of said buried layers and said P epitaxial layer.

2. The method of claim 1 further comprising the step of forming a field oxidation layer, wherein said N base for said PNP transistor and a P base for an NPN transistor are formed before forming said field oxidation to give high voltage PNP and NPN transistors.

3. The method of claim 1 further comprising the steps of forming a field oxidation layer, wherein said N base for said PNP transistor and a P base for an NPN transistor are formed after forming said field oxidation layer and before formation of source and drain regions for MOS transistors to give low voltage PNP and NPN transistors.

4. The method of claim 1 further comprising the step of forming an N+ region by ion implantation into said N base region to form a low resistance extrinsic base region, said step of forming by ion implantation also forming source and drain regions for NMOS transistors.

5. The method of claim 1 further comprising the step of implanting ions to form a P+ contact region for said P epi layer as a collector of said PNP transistor, said implanting ions step also forming source and drain regions for PMOS transistors.

6. The method of claim 1 wherein said step of implanting an N base region is done simultaneously with an N− implant for source and drain regions of NMOS transistors, wherein a separate N+ implantation for said source and drain regions is done to give a double diffusion structure for said NMOS transistors.

7. The method of claim 1 further comprising the steps of forming MOS transistors after formation of said buried layers and said P epitaxial layer.

8. The method of claim 7 wherein said MOS transistors include high voltage poly 1 transistors formed with a thick gate oxide and low voltage poly 2 transistors formed with a thin gate oxide.

9. The method of claim 8 wherein said thick gate oxide is formed before said thin gate oxide.

10. A method for forming a vertical PNP transistor on a P substrate comprising the steps of:
    forming an N− buried layer in said P substrate;
    forming a perimeter N+ buried layer around said N− buried layer;
    forming a P+ buried layer in said N− buried layer;
    growing a P epitaxial layer over said buried layers;
    implanting a perimeter N+ sinker region down to said perimeter N+ buried layer, wherein a gap is left between said perimeter N+ buried layer and perimeter N+ sinker region and said P+ buried layer;
    implanting an N base region over said P buried layer;
    implanting a P region in said N base region;
    wherein both of said perimeter N+ buried layer and N− buried layer are formed with an ion implantation of the same species; and
    forming EEPROM after formation of said buried layers and said P epitaxial layer.

11. The method of claim 10 further comprising the step of implanting a P−type material in a field in said P epitaxial layer around and spaced from said N base region to form a P field region.

12. The method of claim 11 further comprising the step of growing a field oxide over said P field region.

13. A method for forming a vertical PNP transistor on a P substrate comprising the steps of:
    forming an N− buried layer in said P substrate;
    forming a perimeter N+ buried layer around said N− buried layer;
    forming a P+ buried layer in said N− buried layer;
    growing a P epitaxial layer over said buried layers;
    implanting a perimeter N+ sinker region down to said perimeter N+ buried layer, wherein a gap is left between said perimeter N+ buried layer and perimeter N+ sinker region and said P+ buried layer;
    implanting an N base region over said P buried layer;
    implanting a P region in said N base region;
    wherein both of said perimeter N+ buried layer and N− buried layer are formed with an ion implantation of the same species; and
    implanting N− for both an N−well for PMOS transistors and as an added implantation over said N+ sinker region.

14. A method for forming a vertical PNP transistor on a P substrate comprising the steps of:
    forming an N− buried layer in said P substrate;
    forming a perimeter N+ buried layer around said N− buried layer;
    forming a P+ buried layer in said N− buried layer;
    growing a P epitaxial layer over said buried layers;
    implanting a perimeter N+ sinker region down to said perimeter N+ buried layer, wherein a gap is left between said perimeter N+ buried layer and perimeter N+ sinker region and said P+ buried layer;
    implanting an N base region over said P buried layer;
    implanting a P region in said N base region;
    wherein both of said perimeter N+ buried layer and N− buried layer are formed with an ion implantation of the same species; and implanting N— for both an N—well for an NPN collector and as an added implantation over said N+ sinker region.

15. A method for forming a vertical PNP transistor on a P substrate comprising the steps of:
   forming an N— buried layer in said P substrate;
   forming a perimeter N+ buried layer around said N— buried layer;
   forming a P+ buried layer in said N— buried layer;
   growing a P epitaxial layer over said buried layers;
   implanting a perimeter N+ sinker region down to said perimeter N+ buried layer, wherein a gap is left between said perimeter N+ buried layer and perimeter N+ sinker region and said P+ buried layer;
   implanting an N base region over said P buried layer;
   implanting a P region in said N base region; and
   implanting N— for both an N—well for PMOS transistors and as an added implantation over said perimeter N+ sinker region.

16. The method of claim 15 further comprising the steps of forming MOS transistors after formation of said buried layers and said P epitaxial layer.

17. The method of claim 15 further comprising the steps of forming EEPROM transistors after formation of said buried layers and said P epitaxial layer.

18. The method of claim 15 further comprising the step of implanting N— for both an N—well for PMOS transistors and as an added implantation over said perimeter N+ sinker region.

19. The method of claim 15 further comprising the step of implanting N— for both an N—well for an NPN collector and as an added implantation over said perimeter N+ sinker region.

20. The method of claim 15 further comprising the step of implanting a P—type material in a field in said P epitaxial layer around and spaced from said N base region to form a P field region.

21. The method of claim 20 further comprising the step of growing a field oxide over said P field region.

22. A method for forming a vertical PNP transistor on a P substrate comprising the steps of:
   forming an N— buried layer in said P substrate;
   forming a perimeter N+ buried layer around said N— buried layer;
   forming a P+ buried layer in said N— buried layer;
   growing a P epitaxial layer over said buried layers;
   implanting a perimeter N+ sinker region down to said perimeter N+ buried layer, wherein a gap is left between said perimeter N+ buried layer and perimeter N+ sinker region and said P+ buried layer;
   implanting an N base region over said P buried layer;
   implanting a P region in said N base region; and
   implanting N— for both an N-well for an NPN collector and as an added implantation over said perimeter N+ sinker region.

23. A method for forming a vertical PNP transistor on a P substrate comprising the steps of:
   forming an N— buried layer in said P substrate;
   forming a perimeter N+ buried layer around said N— buried layer;
   forming a P+ buried layer in said N— buried layer;
   growing a P epitaxial layer over said buried layers;
   implanting a perimeter N+ sinker region down to said perimeter N+ buried layer, wherein a gap is left between said perimeter N+ buried layer and perimeter N+ sinker region and said P+ buried layer;
   implanting an N base region over said P buried layer;
   implanting a P region in said N base region;
   wherein both of said perimeter N+ buried layer and N— buried layer are formed with an ion implantation of the same species; and
   forming EEPROM transistors after formation of said buried layers and said P epitaxial layer.

24. A method for forming a vertical PNP transistor on a P substrate comprising the steps of:
   forming an N— buried layer in said P substrate;
   forming a perimeter N+ buried layer around said N— buried layer;
   forming a P+ buried layer in said N— buried layer;
   growing a P epitaxial layer over said buried layers;
   implanting a perimeter N+ sinker region down to said perimeter N+ buried layer, wherein a gap is left between said perimeter N+ buried layer and perimeter N+ sinker region and said P+ buried layer;
   implanting an N base region over said P buried layer;
   implanting a P region in said N base region;
   wherein both of said perimeter N+ buried layer and N— buried layer are formed with an ion implantation of the same species; and
   implanting N— for both an N—well for PMOS transistors and as an added implantation over said perimeter N+ sinker region.

25. A method for forming a vertical PNP transistor on a P substrate comprising the steps of:
   forming an N— buried layer in said P substrate;
   forming a perimeter N+ buried layer around said N— buried layer;
   forming a P+ buried layer in said N— buried layer;
   growing a P epitaxial layer over said buried layers;
   implanting a perimeter N+ sinker region down to said perimeter N+ buried layer, wherein a gap is left between said perimeter N+ buried layer and perimeter N+ sinker region and said P+ buried layer;
   implanting an N base region over said P buried layer;
   implanting a P region in said N base region;
   wherein both of said perimeter N+ buried layer and N— buried layer are formed with an ion implantation of the same species; and
   implanting N— for both an N—well for an NPN collector and as an added implantation over said perimeter N+ sinker region.

* * * * *